US008854529B2

(12) United States Patent
Yoshimura et al.

(10) Patent No.: US 8,854,529 B2
(45) Date of Patent: Oct. 7, 2014

(54) IMAGE CAPTURING APPARATUS AND FOCUS DETECTION METHOD (71) Applicant: Canon Kabushiki Kaisha, Tokyo (JP)

(72) Inventors: Yuki Yoshimura, Tokyo (JP); Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 39 days.

(21) Appl. No.: 13/692,173

(22) Filed: Dec. 3, 2012

(65) Prior Publication Data

US 2013/0147998 A1    Jun. 13, 2013

(30) Foreign Application Priority Data

Dec. 13, 2011    (JP) .................................. 2011-272746

(51) Int. Cl.
*G03B 13/00* (2006.01)
*H04N 5/232* (2006.01)
*H04N 5/228* (2006.01)
*G06K 9/40* (2006.01)

(52) U.S. Cl.
CPC .................................. *H04N 5/23212* (2013.01)
USPC ......... 348/345; 348/222.1; 348/349; 382/255

(58) Field of Classification Search
CPC .......... H04N 5/23212; H04N 5/23229; H04N 5/235; H04N 5/2355; H04N 5/3572; G02B 7/365; G03B 13/36
USPC ................ 348/345–356, 222.1, 223.1, 224.1; 382/255
See application file for complete search history.

(56) References Cited

U.S. PATENT DOCUMENTS

| 4,731,864 | A | * | 3/1988 | Modla | 382/255 |
| 4,975,726 | A | * | 12/1990 | Kuga et al. | 396/101 |
| 5,083,150 | A | * | 1/1992 | Nagasaki et al. | 396/49 |
| 5,115,262 | A | * | 5/1992 | Komiya | 396/91 |
| 5,193,124 | A | * | 3/1993 | Subbarao | 382/255 |
| 5,874,994 | A | * | 2/1999 | Xie et al. | 348/349 |

(Continued)

FOREIGN PATENT DOCUMENTS

| JP | 01-216306 | 8/1989 |
| JP | 05-127074 A | 5/1993 |
| JP | 07-318793 | 12/1995 |

OTHER PUBLICATIONS

Oct. 4, 2013 European Search Report that issued in the corresponding European Patent Application No. 12194091.0.

(Continued)

*Primary Examiner* — Chia-Wei A Chen
(74) *Attorney, Agent, or Firm* — Cowan, Liebowitz & Latman, P.C.

(57) ABSTRACT

An image capturing apparatus performs focus detection based on a pair of image signals obtained from an image sensor including pixels each having a pair of photoelectric conversion units capable of outputting the pair of image signals obtained by independently receiving a pair of light beams that have passed through different exit pupil regions of an imaging optical system. In the focus detection, an f-number of the imaging optical system is acquired, the pair of image signals undergo filtering using a first filter formed from an summation filter when the f-number is less than a predetermined threshold, or using a second filter formed from the summation filter and a differential filter when the f-number is not less than the threshold, and focus detection is performed by a phase difference method based on the pair of filtered image signals.

4 Claims, 9 Drawing Sheets

(56) References Cited

U.S. PATENT DOCUMENTS

| | | | |
|---|---|---|---|
| 6,900,841 B1* | 5/2005 | Mihara | 348/345 |
| 7,099,555 B2* | 8/2006 | Onuki et al. | 385/147 |
| 7,538,803 B2* | 5/2009 | Kurosawa | 348/239 |
| 7,729,602 B2* | 6/2010 | Janson et al. | 396/85 |
| 7,859,588 B2* | 12/2010 | Parulski et al. | 348/349 |
| 8,212,889 B2* | 7/2012 | Chanas et al. | 348/224.1 |
| 8,411,982 B2* | 4/2013 | Chen | 382/255 |
| 8,494,301 B2* | 7/2013 | Adams, Jr. | 382/255 |
| 2003/0103157 A1* | 6/2003 | Watanabe et al. | 348/360 |
| 2004/0207747 A1 | 10/2004 | Ikeda | |
| 2008/0107350 A1* | 5/2008 | Guichard et al. | 382/255 |
| 2009/0256952 A1 | 10/2009 | Kusaka | |
| 2011/0085786 A1* | 4/2011 | Tamaki | 396/104 |
| 2013/0242129 A1* | 9/2013 | Harmeling et al. | 348/222.1 |

OTHER PUBLICATIONS

May 22, 2013 Partial European Search Report of the counterpart European Patent Application No. 12194091.0.

* cited by examiner

SUMMATION FILTER

FIG. 6B

DIFFERENTIAL FILTER

FIG. 7A SUMMATION FILTER

FIG. 7B DIFFERENTIAL FILTER

FIG. 8A ONE-LINE CHART

FIG. 8B TWO-LINE CHARTS

IMAGE CAPTURING APPARATUS AND FOCUS DETECTION METHOD

BACKGROUND OF THE INVENTION

1. Field of the Invention

The present invention relates to a focus detection technique used in an image capturing apparatus such as an electronic camera.

2. Description of the Related Art

A conventional focus detection apparatus adopting a pupil division method using an image sensor is disclosed in, for example, Japanese Patent Laid-Open No. 01-216306. Such a focus detection apparatus adopting a pupil division method can detect a defocus amount by performing measurement only once even in a greatly defocused state. This method is promising because high-speed focus adjustment is possible.

On the other hand, applying differential filtering to an image signal is generally performed as a technique to improve the accuracy of defocus amount detection. An example of the effect of the differential filtering is an improvement in the direction detection accuracy. Japanese Patent Laid-Open No. 07-318793 discloses performing two types of differential filtering to improve defocus detection accuracy when vignetting has occurred.

In an apparatus that divides the pupil by dividing a photoelectric conversion unit, however, the pupil division characteristic near the optical axis is sometimes insufficient. In addition, when the f-number is small, the asymmetry of an image signal is large. For this reason, distortion is enhanced by differential filtering, which may cause a difficulty in even detecting the direction of defocus.

SUMMARY OF THE INVENTION

The present invention has been made in consideration of the above situation, and improves defocus direction detection performance in focus detection of a pupil division phase difference method even when the pupil division performance is insufficient, and the influence of vignetting is large.

According to a first aspect of the present invention, there is provided an image capturing apparatus comprising: an image sensor including a plurality of two-dimensionally arranged pixels including pixels each having a pair of photoelectric conversion units arranged to output a pair of image signals obtained by independently receiving a pair of light beams that have passed through different exit pupil regions of an imaging optical system; a first filter formed from a summation filter; a second filter formed from the summation filter and a differential filter; an acquisition unit arranged to acquire an f-number of the imaging optical system; a filtering unit arranged to perform filtering of the pair of image signals by selecting the first filter when the f-number is less than a predetermined threshold and selecting the second filter when the f-number is not less than the threshold; and a focus detection unit arranged to perform focus detection by a phase difference method based on the pair of image signals that have undergone the filtering by the filtering unit.

According to a second aspect of the present invention, there is provided an image sensor adapted for use in the above image capturing apparatus.

According to a third aspect of the present invention, there is provided an image capturing apparatus comprising: an image sensor including a plurality of two-dimensionally arranged pixels including pixels each having a pair of photoelectric conversion units arranged to output a pair of image signals obtained by independently receiving a pair of light beams that have passed through different exit pupil regions of an imaging optical system; a first filter formed from a summation filter; a second filter formed from the summation filter and a differential filter; an acquisition unit arranged to acquire an f-number of the imaging optical system and a pupil distance of the imaging optical system; a filtering unit arranged to evaluate an effect of vignetting based on the f-number and the pupil distance, and to perform filtering of the pair of image signals by selecting the first filter when the effect of vignetting is more than a predetermined threshold and selecting the second filter when the effect of vignetting is not more than the threshold; and a focus detection unit arranged to perform focus detection by a phase difference method based on the pair of image signals that have undergone filtering by the filtering unit.

According to a fourth aspect of the present invention, there is provided an image sensor adapted for use in the above image capturing apparatus.

According to a fifth aspect of the present invention, there is provided a focus detection method of performing focus detection based on a pair of image signals obtained from an image sensor including a plurality of two-dimensionally arranged pixels including pixels each having a pair of photoelectric conversion units capable of outputting the pair of image signals obtained by independently receiving a pair of light beams that have passed through different exit pupil regions of an imaging optical system, the method comprising: an acquisition step of acquiring an f-number of the imaging optical system; a filtering step of performing filtering of the pair of image signals using a first filter formed from a summation filter when the f-number is less than a predetermined threshold, and performing filtering of the pair of image signals using a second filter formed from the summation filter and a differential filter when the f-number is not less than the threshold; and a focus detection step of performing focus detection by a phase difference method based on the pair of image signals that have undergone the filtering in the filtering step.

According to a sixth aspect of the present invention, there is provided a focus detection method of performing focus detection based on a pair of image signals obtained from an image sensor including a plurality of two-dimensionally arranged pixels including pixels each having a pair of photoelectric conversion units capable of outputting the pair of image signals obtained by independently receiving a pair of light beams that have passed through different exit pupil regions of an imaging optical system, the method comprising: an acquisition step of acquiring an f-number and a pupil distance of the imaging optical system; an evaluation step of evaluating an effect of vignetting based on the f-number and the pupil distance; a filtering step of performing filtering of the pair of image signals using a first filter formed from a summation filter when the effect of vignetting is more than a predetermined threshold, and performing filtering of the pair of image signals using a second filter formed from the summation filter and a differential filter when the effect of vignetting is not more than the threshold; and a focus detection step of performing focus detection by a phase difference method based on the pair of image signals that have undergone the filtering in the filtering step.

Further features of the present invention will become apparent from the following description of embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Embodiments of the present invention will be described in detail in accordance with the accompanying drawings. Each of the embodiments of the present invention described below can be implemented solely or as a combination of a plurality of the embodiments or features thereof where necessary or where the combination of elements or features from individual embodiments in a single embodiment is beneficial.

(Configuration of an Image Capturing Apparatus)

Figure 1:
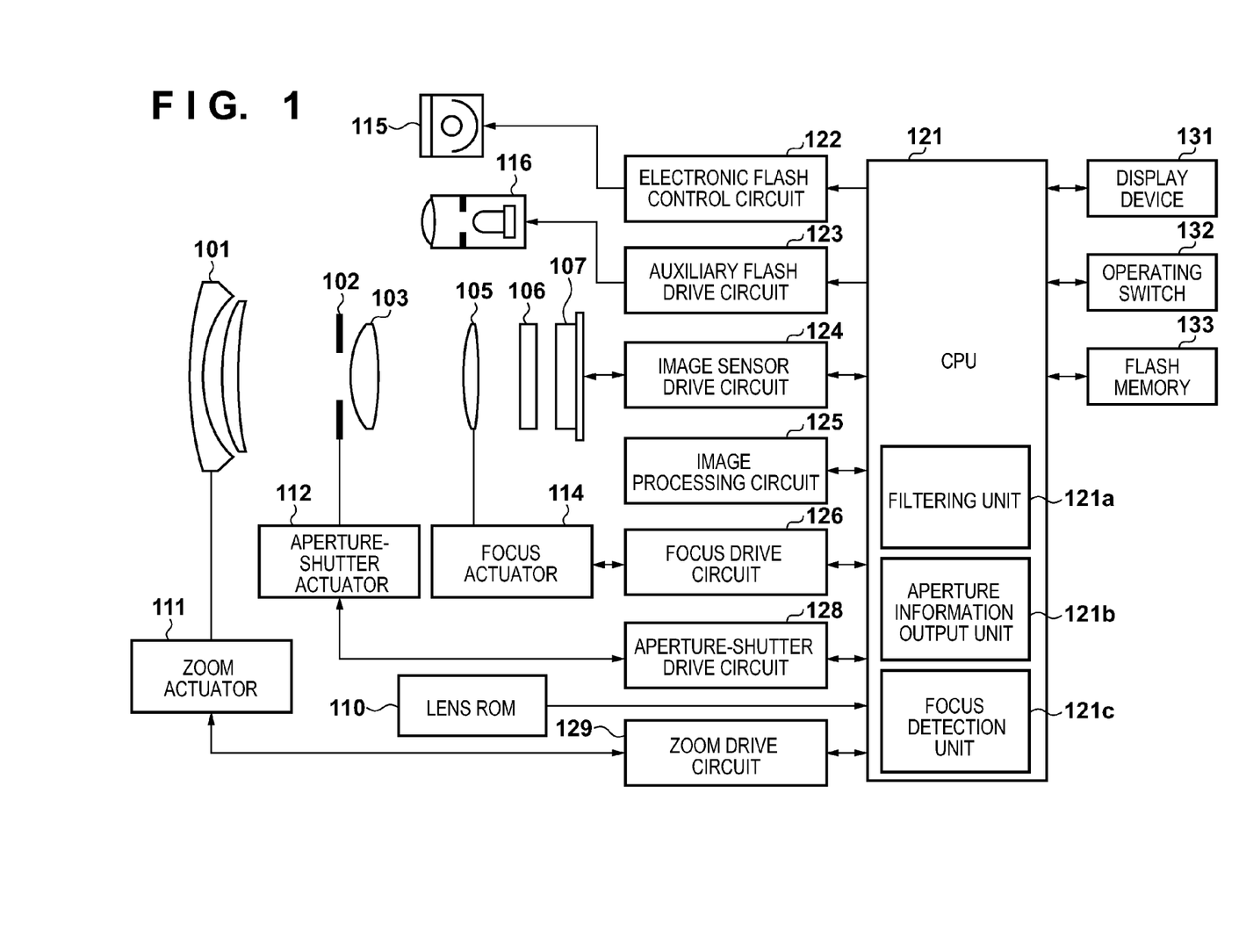
FIG. 1 is a block diagram showing the schematic arrangement of an image capturing apparatus according to the embodiment of the present invention.

FIG. 1 is a configurational diagram of an image capturing apparatus according to an embodiment of the present invention, showing an electronic camera in which a camera body including an image sensor and a photographing optical system are integrated into a single unit. In FIG. 1, a first lens group 101 is disposed on the front end of a photographing optical system (imaging optical system), and supported so as to be movable forward and backward along an optical axis. An aperture-shutter 102 adjusts the diameter of its opening, thereby adjusting the amount of light during photography, and also has a function to adjust the exposure time during still image photography. The aperture-shutter 102 and a second lens group 103 move together forward and backward along the optical axis, and, in conjunction with the movement forward and backward of the first lens group 101, provide a magnification change effect (a zoom function).

A third lens group 105 carries out focus adjustment by moving forward and backward along the optical axis. A low-pass optical filter 106 is an optical element for the purpose of reducing false color and moiré of a photographed image. An image sensor 107 is composed of a CMOS image sensor and the surrounding circuitry. A two-dimensional, single-plate color sensor in which an on-chip Bayer arrangement primary color mosaic filter is disposed on light-receiving pixels arranged m pixels in the row direction by n pixels in the column direction is used as the image sensor 107.

A lens ROM 110 stores lens information necessary in focus detection and the like, and communicates with a CPU 121. The lens information includes pupil information including an exit pupil distance.

A zoom actuator 111 carries out a magnification-change operation by rotation of a cam barrel, not shown, to move the first lens group 101 through the second lens group 103 forward and backward along the optical axis. An aperture-shutter actuator 112 controls the diameter of the opening of the aperture-shutter 102 and adjusts the amount of light for photography, and also controls the exposure time during still image photography. A focus actuator 114 moves the third lens group 105 forward and backward along the optical axis to adjust the focus.

An electronic flash 115 for illuminating an object is used during photography. A flash illumination device that uses a Xenon tube is preferable, but an illumination device comprised of a continuous-flash LED may also be used. An AF auxiliary flash unit 116 projects an image of a mask having a predetermined opening pattern onto an object field through a projective lens to improve focus detection capability with respect to dark objects and low-contrast objects.

The CPU 121 controls the camera main unit in various ways within the image capturing apparatus. The CPU 121 may, for example, have a calculation unit, ROM, RAM, A/D converter, D/A converter, communication interface circuitry, and so forth. In addition, the CPU 121, based on predetermined programs stored in the ROM, drives the various circuits that the image capturing apparatus has, and executes a set of operations of photography, development, and recording. In this embodiment, the CPU 121 includes a filtering unit 121a that performs filtering for focus detection, an aperture information output unit 121b that performs photometry based on an image signal from the image sensor 107, and obtains and outputs an f-number, and a focus detection unit 121c that performs focus detection processing.

An electronic flash control circuit 122 controls firing of the electronic flash 115 in synchrony with a photography operation. An auxiliary flash drive circuit 123 controls firing of the AF auxiliary flash unit 116 in synchrony with a focus detection operation. An image sensor drive circuit 124 controls the image sensing operation of the image sensor 107 as well as A/D-converts acquired image signals and transmits the converted image signals to the CPU 121. An image processing circuit 125 performs such processing as γ conversion, color interpolation, interpolation processing which will be described below, JPEG compression and the like on the images acquired by the image sensor 107.

A focus drive circuit 126 controls the drive of the focus actuator 114 based on the focus detection result from the focus detection unit 121c in the CPU 121 to drive the third lens group 105 reciprocally in the optical axis direction, thereby performing focus adjustment. An aperture-shutter drive circuit 128 controls the drive of the aperture-shutter actuator 112 based on an f-number output from the aperture information output unit 121b in the CPU 121, thereby driving the opening of the aperture-shutter 102. A zoom drive circuit 129 drives the zoom actuator 111 in accordance with the zoom operation of the user.

A display device 131, such as an LCD, displays information relating to the photographic mode of the image capturing apparatus, preview images before photographing, confirmation images after photographing, focus state display images during focus detection, and the like. An operating switch group 132 is composed of a power switch, a release (photography trigger) switch, a zoom operation switch, a photographic mode selection switch, and the like. A detachable flash memory 133 records photographed images.

(Structure of Image Sensor)

Figure 2A:
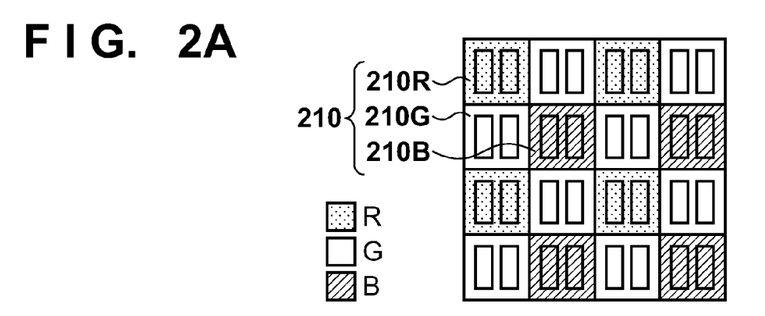
FIGS. 2A to 2C are views for explaining the arrangement of an image sensor according to the embodiment.
Figure 2B:
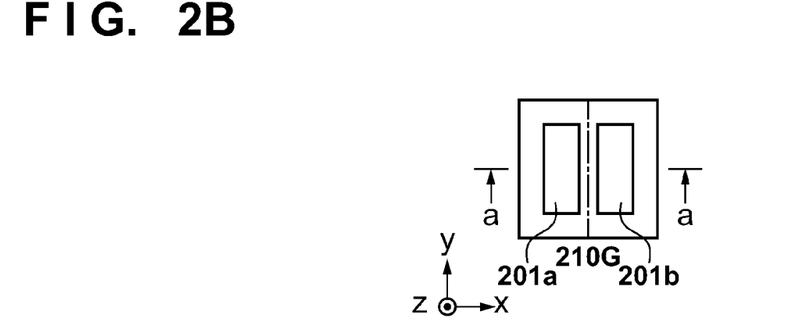

FIG. 2A is a view for explaining the pixel arrangement of the image sensor 107 including an on-chip Bayer arrangement primary color mosaic filter. A pixel range in 4 rows×4 columns is illustrated here. A pixel group 210 includes pixels in 2 rows×2 columns. Pixels 210G having green (G) spectral sensitivity are arranged as two diagonal pixels. A pixel 210R having red (R) spectral sensitivity and a pixel 210B having blue (B) spectral sensitivity are arranged as the two remaining pixels. FIG. 2B is an enlarged view of the pixel 210G which includes a plurality of photoelectric conversion units (to be referred to as "sub-pixels 201a and 201b" hereinafter) for pupil division. Each of the pixels 210R and 210B also includes two sub-pixels 201a and 201b. Each pixel can output an image signal obtained by receiving light independently from each of the sub-pixels 201a and 201b. The independently obtained image signals can be used for focus detection, or added for each pixel and used for image capturing. The pixel group 210 having the above-described structure is repetitively arranged. Note that in the arrangement shown in FIGS. 2A and 2B, all pixels include the sub-pixels 201a and 201b. Instead, the pixels including the sub-pixels may be discretely arranged in the image sensor 107.

Figure 2C:
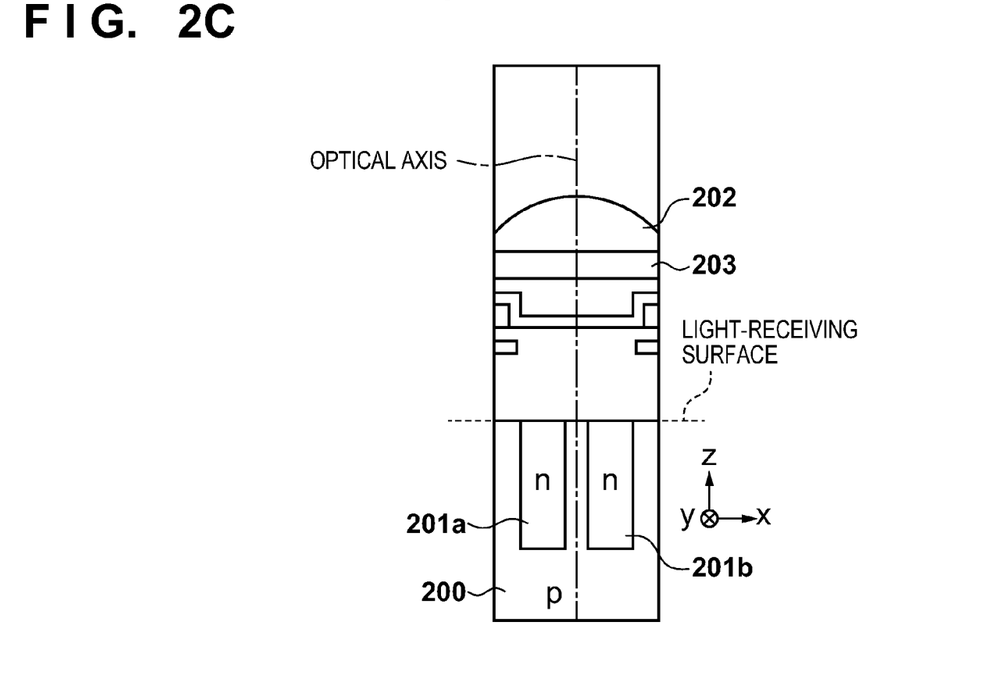

FIG. 2C is a sectional view taken along a line a-a in FIG. 2B. Referring to FIG. 2C, reference numeral 200 denotes a p-type layer; 202, an on-chip microlens; and 203, a color filter that mainly passes light in the G wavelength band. Two n-type layers are formed in the p-type layer 200, thereby forming the sub-pixels 201a and 201b. The sub-pixels 201a and 201b decenter in the +x- and −x-directions with respect to the optical axis. This allows to divide the pupil using one microlens 202. Note that the pixels 210R and 210B have the same structure except that they have R and B wavelength bands as the band of light passing through the color filter 203.

(Concept of Pupil Division of Image Sensor)

Figure 3A:
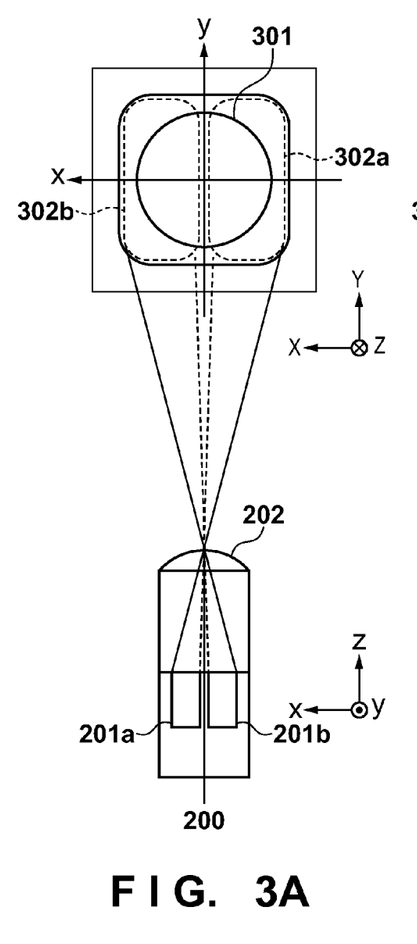
FIGS. 3A and 3B are views for explaining the concept of pupil division according to the embodiment.
Figure 3B:
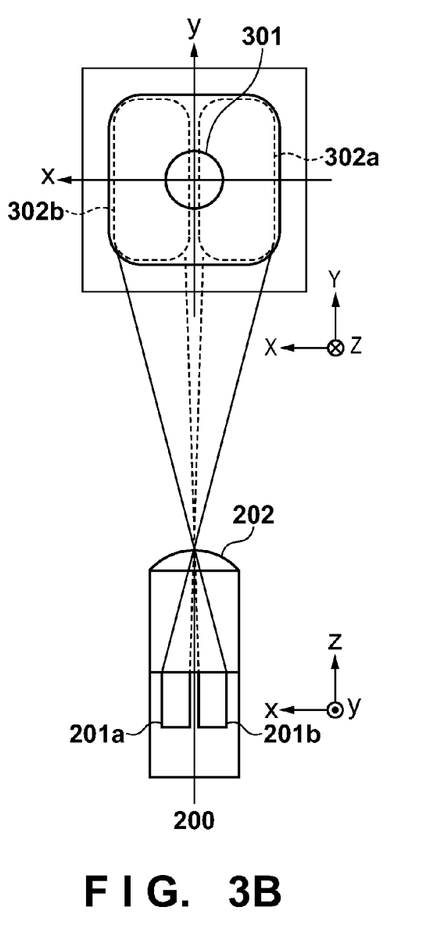

The concept of pupil division will be explained next with reference to FIGS. 3A and 3B using, as an example, the pixel 210G that is one of the pixels included in the image sensor 107 shown in FIG. 2B. FIG. 3A shows a case in which an exit pupil 301 is large, and FIG. 3B shows a case in which the exit pupil 301 is small. The size of the exit pupil 301 changes depending on the size of the opening of the aperture, the size of a lens frame holding a lens, and the like. Reference numeral 302a denotes a shape of the sub-pixel 201a projected to the exit pupil position; and 302b, a shape of the sub-pixel 201b projected to the exit pupil position.

A first image signal acquired from the sub-pixels 201a periodically arranged in the x-direction is defined as an image signal ImgA (one of the image signals obtained from a pair of light beams that have passed through different exit pupil regions of the imaging optical system). Similarly, a second image signal acquired from the sub-pixels 201b periodically arranged in the x-direction is defined as an image signal ImgB (the other of the image signals obtained from a pair of light beams that have passed through different exit pupil regions of the imaging optical system). The focus detection unit 121c can calculate the focus position of the imaging optical system by calculating a defocus amount from the relative image shift amount between the image signal ImgA and the image signal ImgB using correlation calculation. The out-of-focus amount of the imaging optical system is adjusted based on the thus obtained focus position. Note that an arrangement corresponding to an object having a luminance distribution in the x-direction has been described here. An arrangement corresponding to an object having a luminance distribution in the y-direction can be attained by providing the same arrangement in the y-direction.

(Difference in Line Image Based on F-Number)

Figure 4:
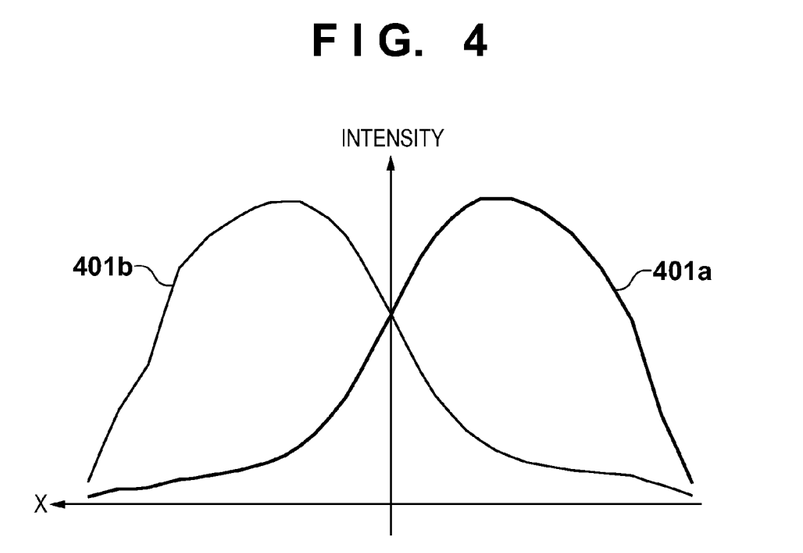
FIG. 4 is a graph showing examples of pupil intensity distributions along the x-axis.

FIG. 4 is a graph showing examples of pupil intensity distributions on the x-axis at the exit pupil position of the photographing lens corresponding to the sub-pixels 201a and 201b in the full-aperture state. Place focus on a pupil intensity distribution 401a of the sub-pixel 201a. The pupil intensity distribution has a moderate curve on the +x side because of a diffraction blur caused by insufficient pupil division performance of the sensor. On the other hand, a sharp curve is formed on the opposite −x side due to vignetting caused by the lens frame. For these reasons, the pupil intensity distribution 401a is asymmetrical with respect to the intensity peak. The same description as that for the pupil intensity distribution 401a applies to a pupil intensity distribution 401b of the sub-pixel 201b except that the positive and negative signs are reversed.

Figure 5A:
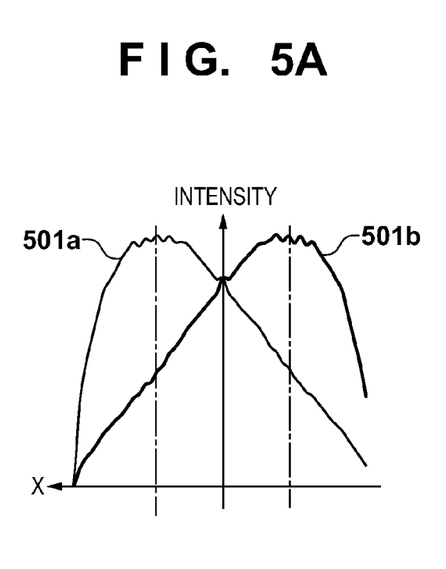
FIGS. 5A and 5B are graphs showing examples of line images of the pupil intensity distribution.
Figure 5B:
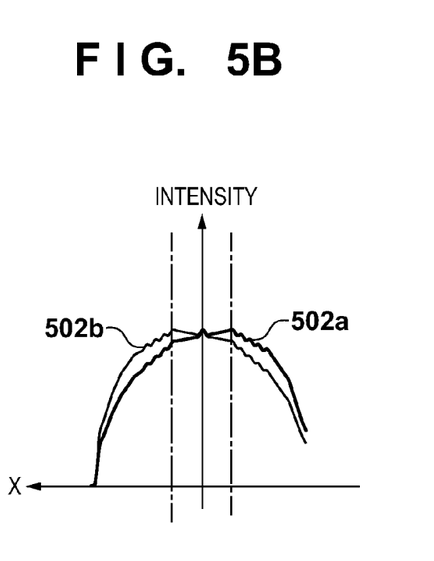

FIG. 5A shows line images obtained by integrating pupil intensity distributions in the y-direction when the f-number is small, as in FIG. 3A. FIG. 5B shows line images obtained by integrating pupil intensity distributions in the y-direction when the f-number is large, as in FIG. 3B. Line images 501a and 501b shown in FIG. 5A have a moderate curve caused by a diffraction blur on one side and a sharp curve caused by vignetting of the aperture frame on the other side, like the pupil intensity distributions 401a and 401b shown in FIG. 4. On the other hand, line images 502a and 502b shown in FIG. 5B have a sharp curve caused by vignetting of the aperture frame on both sides. Note that the broken lines in FIGS. 5A and 5B indicate the points of intensity peaks in the respective f-numbers. As can be seen from FIGS. 5A and 5B, the degree of asymmetry of the pupil intensity distribution with respect to the optical axis changes depending on the f-number. The smaller the f-number is, the larger the asymmetry of the intensity with respect to the peak is.

(Filtering for Edge Extraction)

Figure 6A:
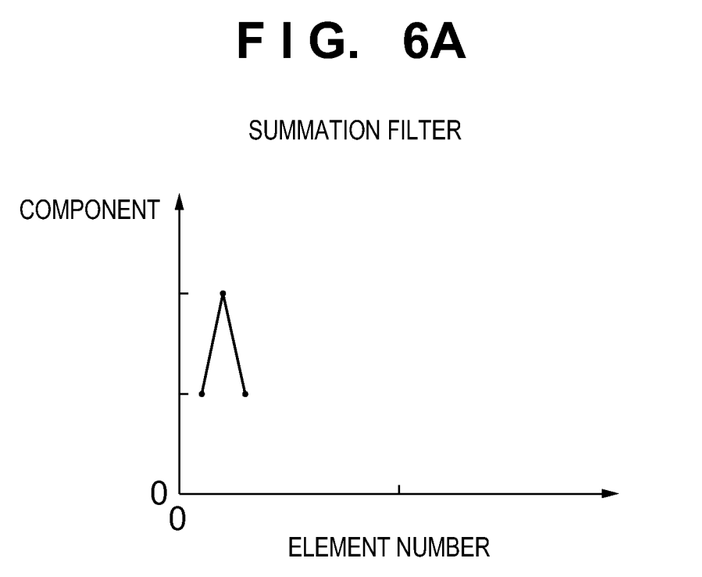
FIGS. 6A and 6B are graphs showing the characteristics of filters according to the embodiment.
Figure 6B:
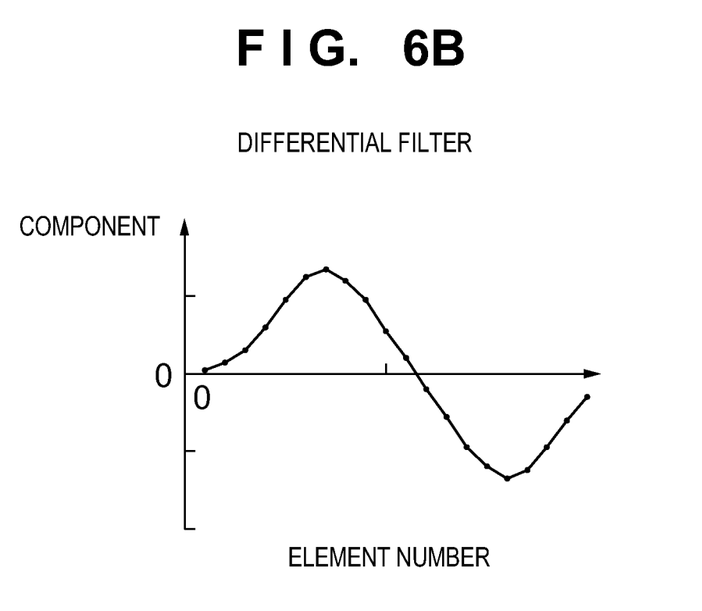
Figure 7A:
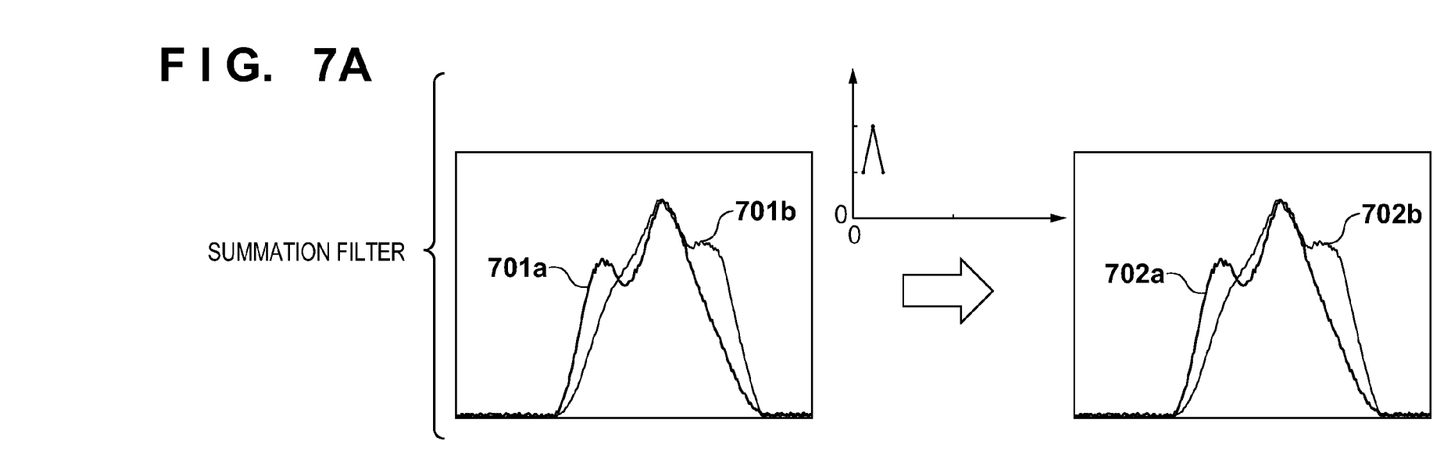
FIGS. 7A and 7B are graphs showing examples of line images before and after filtering.

FIGS. 6A and 6B are graphs showing the characteristics of filters used in the filtering unit 121a. The ordinate represents the component of the filter, and the abscissa represents the element number of the filter. In the filter shown in FIG. 6A, the number of elements of the filter is 3. Let i be the element number of the filter, a[i] be the component of the filter of the element number i, Img[n] be the nth image signal before filtering, and Img'[n] be the nth image signal after filtering. In this case, $$Img'[n] = \sum_{i=1}^{3} a[i] \cdot Img[n+i-2] \Big/ \sum_{i=1}^{3} a[i] \quad (1)$$

is obtained. Two types of filters are mainly used to improve the focus detection accuracy, as shown in FIGS. 6A and 6B. One is a summation filter in which all components have positive values, as shown in FIG. 6A. All the components a[i] of the summation filter have positive values. The summation filter aims at smoothing such as removing high-frequency noise and reducing the sensitivity variation between pixels. As shown in FIG. 7A, when the summation filter shown in FIG. 6A is applied to image signals 701a and 701b, image signals 702a and 702b are obtained.

Figure 7B:
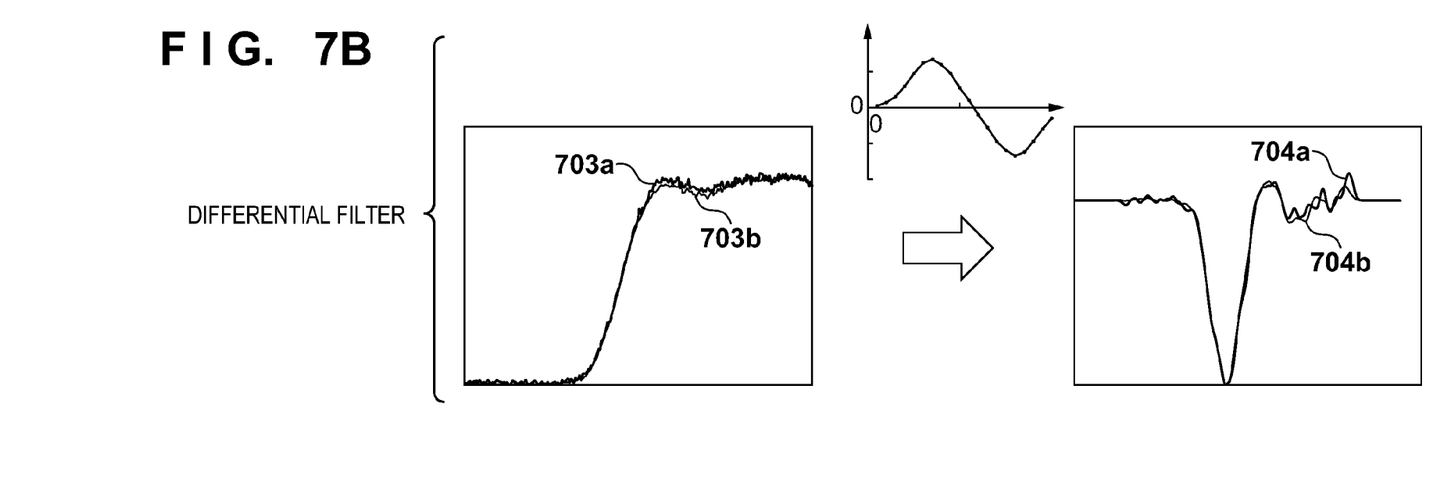

The other is a differential filter shown in FIG. 6B, which includes positive and negative values. That is, in relational expression (1), the components a[i] of the differential filter take positive and negative values. The differential filter aims at extracting an edge of an image by removing DC component noise and the like of an image signal and thus improving the coincidence of two images at the time of correlation calculation. As shown in FIG. 7B, when the differential filter aiming at DC component removal shown in FIG. 6B is applied to image signals 703a and 703b, image signals 704a and 704b are obtained. When performing focus detection, generally, both the summation filter and the differential filter are applied.

Figure 8A:
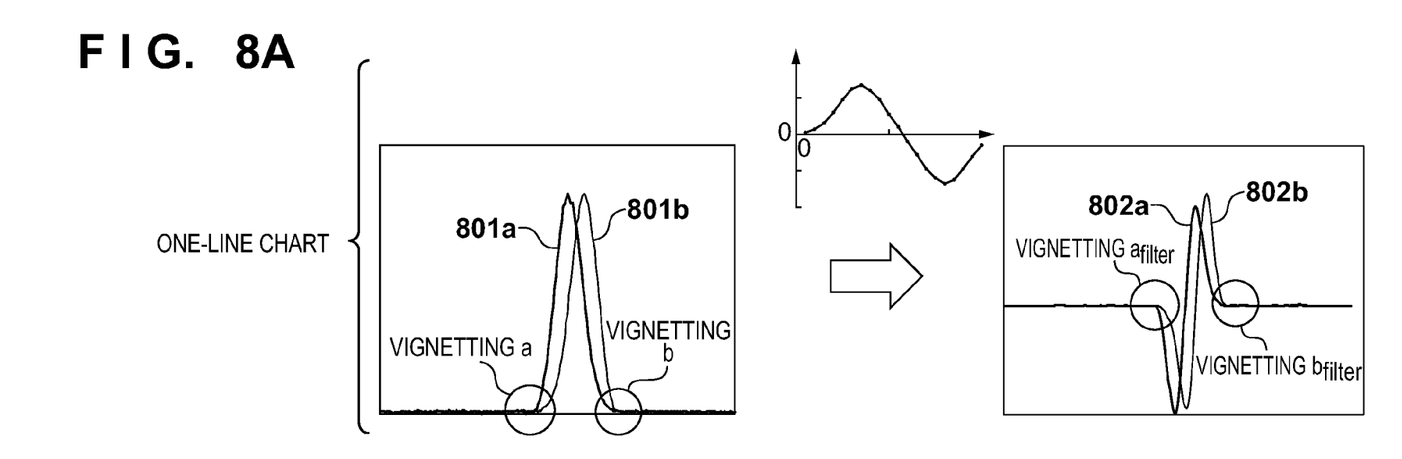
FIGS. 8A and 8B are graphs showing examples of line images before and after filtering.
Figure 8B:
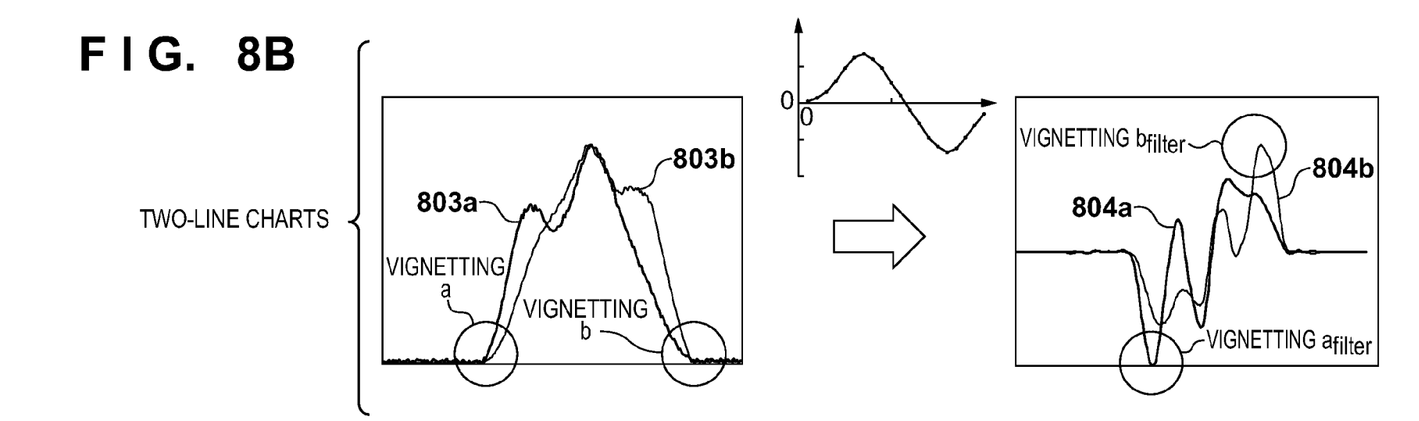

The differential filter corrects a DC component shift between two images at the time of correlation calculation and improves the coincidence of the images. However, if the differential filter is applied in a state in which vignetting or the like occurs and the asymmetry of two images is large, the portions having different slopes due to the influence of vignetting a and vignetting b are enhanced, as shown in FIG. 8A (vignetting $a_{filter}$, vignetting $b_{filter}$). FIG. 8B shows image signals when two-line chart is photographed. When the differential filter is applied, the vignetting a and vignetting b are enhanced, and the coincidence of the two images lowers (vignetting $a_{filter}$, vignetting $b_{filter}$) as is apparent. Hence, when the asymmetry of two images is large due to the influence of vignetting or the like, the coincidence of the two images can be raised by performing only summation filtering without performing differential filtering.

When the f-number is small, the asymmetry of two images is large, as described with reference to FIG. 5A. On the other hand, since the base line length can be long and the sensitivity is low, the influence of DC component noise is small. Hence, when the f-number is small, summation filtering is preferably applied. To the contrary, when the f-number is large, the asymmetry of two images is smaller than in the case in which the f-number is small, as described with reference to FIG. 5B. On the other hand, since the base line length is short and the sensitivity is high, the influence of DC component noise becomes large. Hence, when both summation filtering and differential filtering whose components have positive and negative values are applied, the coincidence of two images is high.

As described above, the asymmetry of two images largely depends on the size of the aperture frame. Hence, in this embodiment, when the f-number is smaller than a predetermined threshold, summation filtering is performed. When the f-number is equal to or larger than the predetermined threshold, summation filtering and differential filtering are performed. Appropriately selecting the two types of filters in the above-described way allows the defocus direction detection accuracy to be improved.

Figure 9:
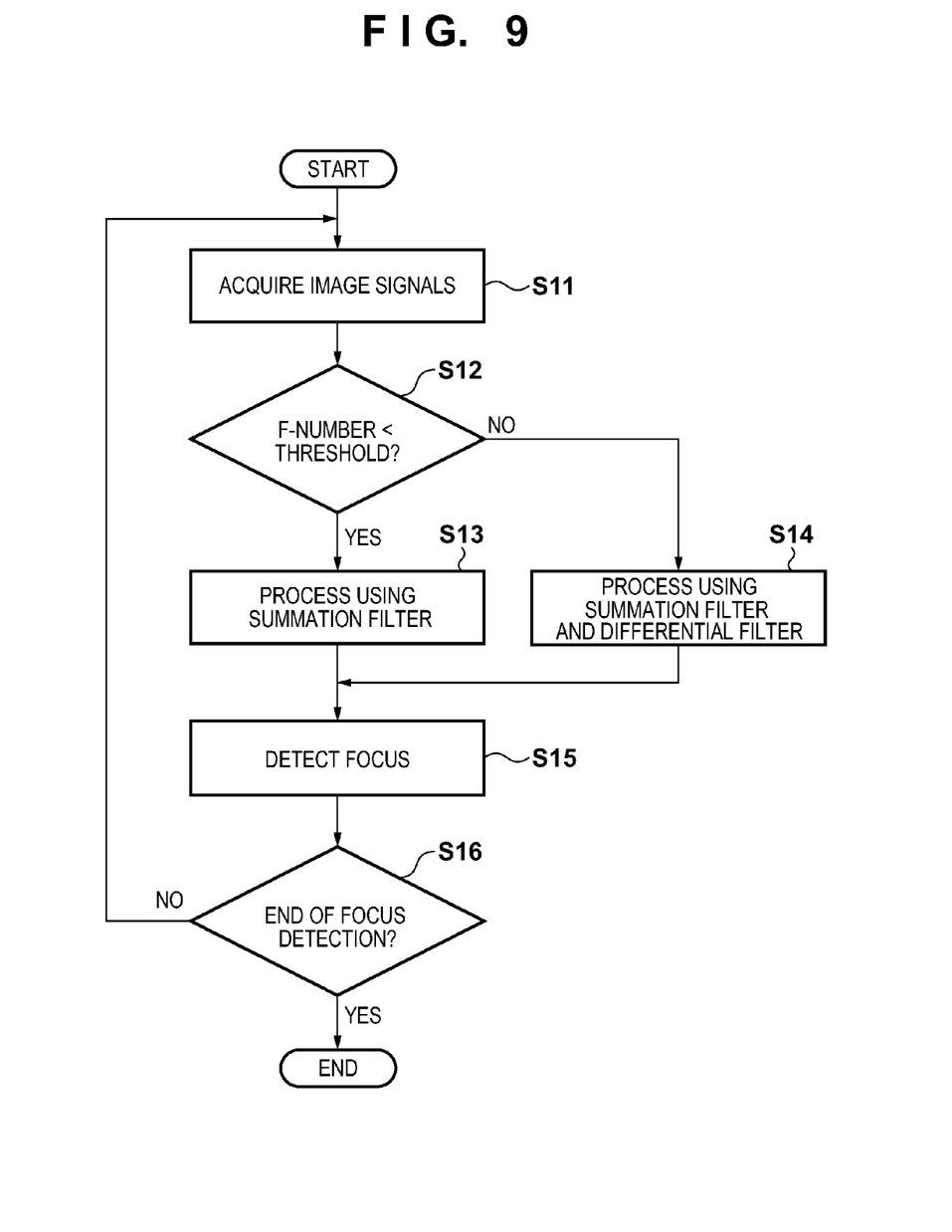
FIG. 9 is a flowchart showing focus detection processing according to the embodiment.

FIG. 9 is a flowchart showing focus detection processing according to this embodiment. First, when focus detection starts, in step S11, the image sensor 107 photoelectrically converts object light that has entered via the imaging optical system to generate image signals and outputs them to the filtering unit 121a. In step S12, an f-number obtained by the aperture information output unit 121b is determined. As a result, if the f-number is smaller than a predetermined threshold (for example, F11), the process advances to step S13. The filtering unit 121a processes the image signals using the summation filter. On the other hand, if the f-number is equal to or larger than the predetermined threshold, the process advances to step S14. The filtering unit 121a processes the image signals using the summation filter and the differential filter. After the filtering, in step S15, the focus detection unit 121c performs correlation calculation, which is a known technique, using the image signals filtered by the filtering unit 121a, and detects the focus of the imaging optical system. The focus actuator 114 drives the third lens group 105 based on the output from the focus detection unit 121c. The above-described processing from image signal acquisition to correlation calculation is performed at least once. Finally, if it is determined in step S16 to end the focus detection, the focus detection ends.

The present invention is superior to the method of Japanese Patent Laid-Open No. 07-318793, which selectively uses two types of differential filters in accordance with vignetting, in that the filtering unit 121a performs filtering using only the summation filter when the f-number is small. Since the differential filter is not used, accurate defocus direction detection performance can be obtained without enhancing the distortion caused by the asymmetry of waveforms.

As described above, according to this embodiment, it is possible to improve defocus direction detection performance in focus detection of a pupil division phase difference method even when the pupil division performance is insufficient, and the influence of vignetting is large.

Modification

As a filter selection method different from the above-described embodiment, when the pupil distance and the f-number are known, the type of vignetting (for example, one of the two line images is largely vignetted, and a degree of asymmetry between the right and left line images is large) by the photographing lens can be evaluated. Hence, the pupil distance and the f-number may be sent to the filtering unit 121a, vignetting evaluation may be performed by the filtering unit 121a, and processing by the summation filter or processing by the summation filter and the differential filter may be selected in accordance with the result.

Figure 10:
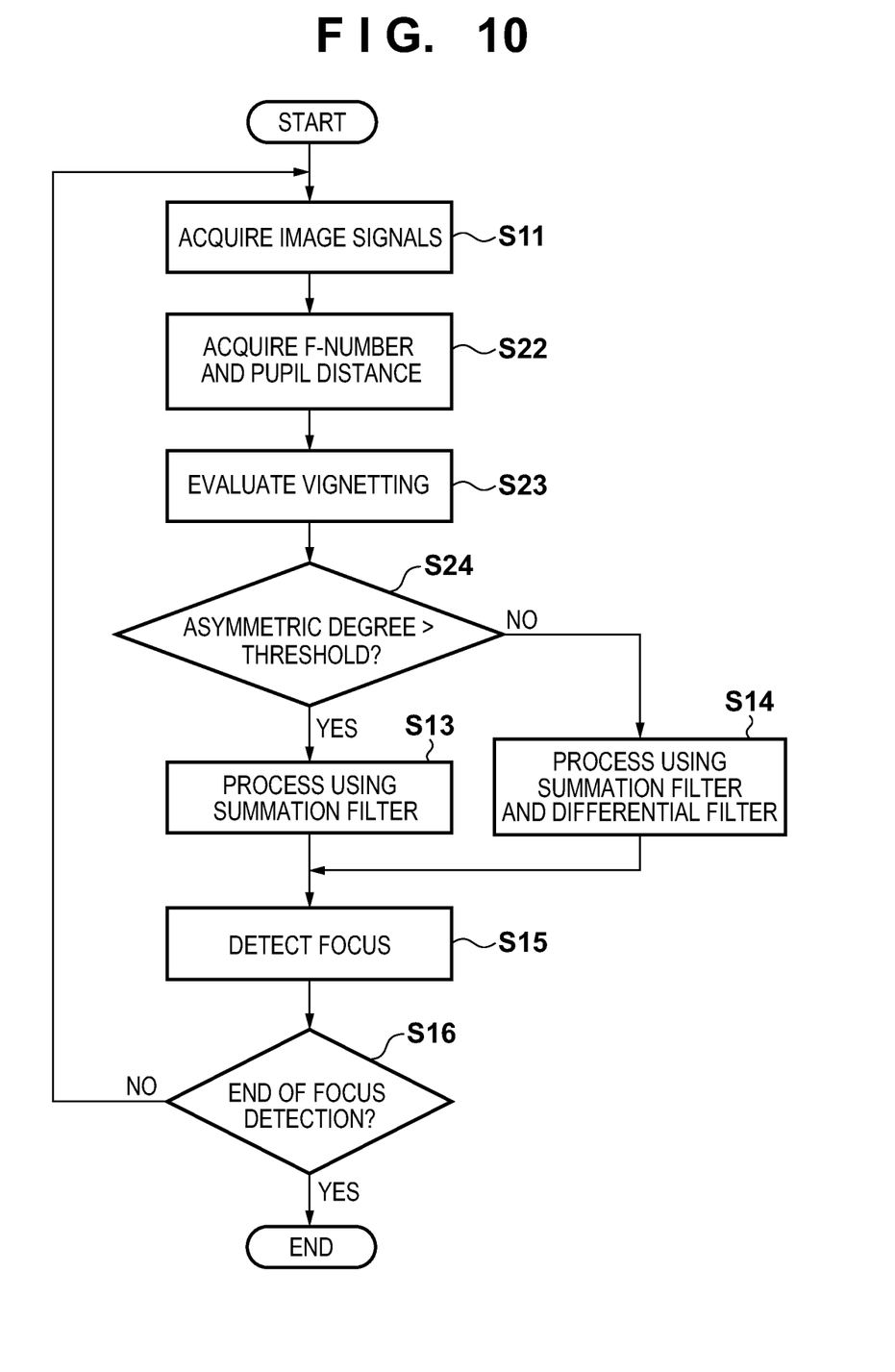
FIG. 10 is a flowchart showing focus detection processing according to a modification of the embodiment.

FIG. 10 is a flowchart showing focus detection processing according to the modification. First, when focus detection starts, in step S11, the image sensor 107 photoelectrically converts object light that has entered via the imaging optical system to generate image signals and outputs them to the filtering unit 121a. In step S22, the f-number is acquired from the aperture information output unit 121b, and pupil information including the pupil distance is acquired from the lens ROM 110. In step S23, vignetting of the line images is evaluated based on the acquired f-number and pupil distance. In step S24, the evaluated vignetting evaluation is performed. As a result, if the degree of asymmetry between the line images due to vignetting is larger than a predetermined threshold (an effect of the vignetting is large), the process advances to step S13. The filtering unit 121a processes the image signals using the summation filter. On the other hand, if the degree of asymmetry between line images due to vignetting is smaller than the predetermined threshold (an effect of the vignetting is small), the process advances to step S14. The filtering unit 121a processes the image signals using the summation filter and the differential filter. The subsequent processing is the same as the processing described above with reference to FIG. 9, and a description thereof will be omitted.

As described above, according to the modification, the degree of asymmetry between line images is evaluated using not only the f-number but also the pupil distance. Processing by the summation filter or processing by the summation filter and the differential filter is selected in accordance with the result. This makes it possible to improve defocus direction detection performance in focus detection of a pupil division phase difference method even when the pupil division performance is insufficient, and the influence of vignetting is large.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-272746 filed on Dec. 13, 2011 which is hereby incorporated by reference herein in its entirety.

What is claimed is:

1. An image capturing apparatus comprising:
   an image sensor including a plurality of two-dimensionally arranged pixels including pixels each having a pair of photoelectric conversion units arranged to output a pair of image signals obtained by independently receiving a pair of light beams that have passed through different exit pupil regions of an imaging optical system;
   a first filter formed from a summation filter;
   a second filter formed from the summation filter and a differential filter;
   an acquisition unit arranged to acquire an f-number of the imaging optical system;
   a filtering unit arranged to perform filtering of the pair of image signals by selecting the first filter when the f-number is less than a predetermined threshold and selecting the second filter when the f-number is not less than the threshold; and
   a focus detection unit arranged to perform focus detection by a phase difference method based on the pair of image signals that have undergone the filtering by the filtering unit.

2. The image capturing apparatus as claimed in claim 1, wherein in the summation filter, all components of the filter have positive values, and in the differential filter all components of the filter have positive and negative values.

3. An image sensor adapted for use in the image capturing apparatus of claim 1.

4. A focus detection method of performing focus detection based on a pair of image signals obtained from an image sensor including a plurality of two-dimensionally arranged pixels including pixels each having a pair of photoelectric conversion units capable of outputting the pair of image signals obtained by independently receiving a pair of light beams that have passed through different exit pupil regions of an imaging optical system, the method comprising:
   an acquisition step of acquiring an f-number of the imaging optical system;
   a filtering step of performing filtering of the pair of image signals using a first filter formed from a summation filter when the f-number is less than a predetermined threshold, and performing filtering of the pair of image signals using a second filter formed from the summation filter and a differential filter when the f-number is not less than the threshold; and
   a focus detection step of performing focus detection by a phase difference method based on the pair of image signals that have undergone the filtering in the filtering step.

* * * * *